(12) United States Patent
Zeituni et al.

(10) Patent No.: US 11,310,455 B2
(45) Date of Patent: Apr. 19, 2022

(54) TAIL CURRENT BOOST CIRCUIT

(71) Applicant: Sony Semiconductor Solutions Corporation, Kanagawa (JP)

(72) Inventors: Golan Zeituni, Kfar-Saba (IL); Noam Eshel, Pardesia (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 287 days.

(21) Appl. No.: 16/746,373

(22) Filed: Jan. 17, 2020

(65) Prior Publication Data

US 2021/0227163 A1 Jul. 22, 2021

(51) Int. Cl.
*H04N 5/378* (2011.01)
*H03F 3/45* (2006.01)

(52) U.S. Cl.
CPC ......... *H04N 5/378* (2013.01); *H03F 3/45183* (2013.01)

(58) Field of Classification Search
CPC .............................. H04N 5/378; H03F 3/45183
See application file for complete search history.

(56) References Cited

U.S. PATENT DOCUMENTS

| 4,701,720 A | 10/1987 | Monticelli | |
| 2008/0273093 A1* | 11/2008 | Okita | H04N 5/335 |
| | | | 348/220.1 |
| 2011/0298644 A1* | 12/2011 | Oh | H03F 3/005 |
| | | | 341/155 |
| 2014/0266435 A1 | 9/2014 | Botker | |
| 2019/0246058 A1 | 8/2019 | Kim et al. | |

FOREIGN PATENT DOCUMENTS

| CN | 106026954 A | 10/2016 | |
| WO | WO-2019150917 A1 * | 8/2019 | ........... H03K 5/2481 |

OTHER PUBLICATIONS

International Search Report & Written Opinion dated Mar. 12, 2021 for corresponding International Patent No. PCT/JP2020/046725.
Hossein Kassiri B. et al., "Slew-Rate Enhancement for a Single-Ended Low-Power Two-Stage Amplifier", Circuits and Systems (ISCAS). 2013 IEEE International Symposium on, IEEE,May 19, 2013 (May 19, 2013), pp. 1829-1832,XP032446294, DOI: 10.1109/ISCAS.2013.6572221, ISBN: 978-1-4673-5760-9, p. 1829, left-hand column paragraph 2, figure 4; p. 1831, left-hand column paragraph 2; p. 1831, right-hand column paragraph 1.

* cited by examiner

*Primary Examiner* — Nicholas G Giles
(74) *Attorney, Agent, or Firm* — Michael Best & Friedrich LLP

(57) ABSTRACT

An image sensor and electronic apparatus comprise a pixel circuit configured to generate an analog signal; a vertical signal line configured to convey the analog signal from the pixel circuit; an analog amplifier circuit configured to receive the analog signal via the vertical signal line and generate an amplified signal; and a tail current boost circuit configured to modify an instantaneous gain bandwidth product of the analog amplifier circuit by temporarily modifying a tail current of the analog amplifier circuit.

20 Claims, 10 Drawing Sheets

TAIL CURRENT BOOST CIRCUIT

BACKGROUND OF THE INVENTION

1. Field of the Invention

This application relates generally to image sensors. More specifically, this application relates to a system and method for increasing the gain bandwidth product in image sensor or other electronic applications.

2. Description of Related Art

Image sensing devices typically consist of an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light.

One example of a pixel circuit is illustrated in FIG. 1. As shown in FIG. 1, a pixel circuit 110 includes a photoelectric conversion device 111 (e.g., a photodiode), a floating diffusion FD, a storage capacitor 112, a transfer transistor 113, a reset transistor 114, a source follower transistor 115, a selection transistor 116, and a vertical signal line 117. As illustrated, the vertical signal line 117 is common to a plurality of pixel circuits within the same column. Alternatively, a particular vertical signal line may be shared among multiple columns. Gate electrodes of transfer transistor 113, reset transistor 114, and selection transistor 116 receive signals TRG, RST, and SEL, respectively. These signals may, for example, be provided by the control or timing circuitry. Light falling on photoelectric conversion device 111 is converted into an analog electrical signal.

While FIG. 1 illustrates a pixel circuit having four transistors in a particular configuration, the present disclosure is not so limited and may apply to a pixel circuit having fewer or more transistors as well as other elements, such as additional capacitors, resistors, and the like. Moreover, while FIG. 1 illustrates the source follower transistor 115 disposed between the selection transistor 116 and a power supply voltage $V_{dd}$, the selection transistor 116 may instead be disposed between the source follower transistor 116 and the power supply voltage $V_{dd}$. Additionally, the current disclosure may be extended to configurations where one or more transistors are shared among multiple photoelectric conversion devices.

The analog electrical signal generated in photoelectric conversion device 111 is retrieved by a readout circuit and is then converted to a digital value. Such a conversion typically requires several circuit components such as sample-and-hold (S/H) circuits, analog-to-digital converters (ADCs), and timing and control circuits, with each circuit component serving a purpose in the conversion. For example, the purpose of the S/H circuit may be to sample the analog signals from different time phases of the photodiode operation, after which the analog signals may be converted to digital form by the ADC.

Some image sensor designs including the above components may further include one or more analog amplifiers for signal processing, feedback, encoding/decoding, and other purposes. For example, it may be possible to increase bandwidth of an amplifier in a high gain implementation by increasing the tail current of the amplifier. However, depending on the semiconductor technology used to provide the image sensor, it may be difficult to increase the tail current of the amplifier due to transistor size, device power consumption, and the like.

Therefore, there exists a need for increased gain bandwidth product in an analog amplifier without increasing the tail current in the amplifier.

BRIEF SUMMARY OF THE INVENTION

Various aspects of the present disclosure relate to an image sensor, readout circuit therefor, and calibration method thereof.

In one aspect of the present disclosure, there is provided an image sensor comprising a pixel circuit configured to generate an analog signal; a vertical signal line configured to convey the analog signal from the pixel circuit; an analog amplifier circuit configured to receive the analog signal via the vertical signal line and generate an amplified signal; and a tail current boost circuit configured to modify an instantaneous gain bandwidth product of the analog amplifier circuit by temporarily modifying a tail current of the analog amplifier circuit.

In another aspect of the present disclosure, there is provided an electronic apparatus including an image sensor, the image sensor including a pixel circuit configured to generate an analog signal; a vertical signal line configured to convey the analog signal from the pixel circuit; an analog amplifier circuit configured to receive the analog signal via the vertical signal line and generate an amplified signal; and a tail current boost circuit configured to modify an instantaneous gain bandwidth product of the analog amplifier circuit by temporarily modifying a tail current of the analog amplifier circuit.

In this manner, the above aspects of the present disclosure provide for improvements in at least the technical field of signal processing, as well as the related technical fields of imaging, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to reduce noise in a signal processing or other analog circuit; for example, an audio signal processing circuit, industrial measurement and systems, and the like. Furthermore, the image sensor implementations described below may be incorporated into an electronic apparatus, including but not limited to a smartphone, a tablet computer, a laptop computer, and the like.

Image Sensor

Figure 1:
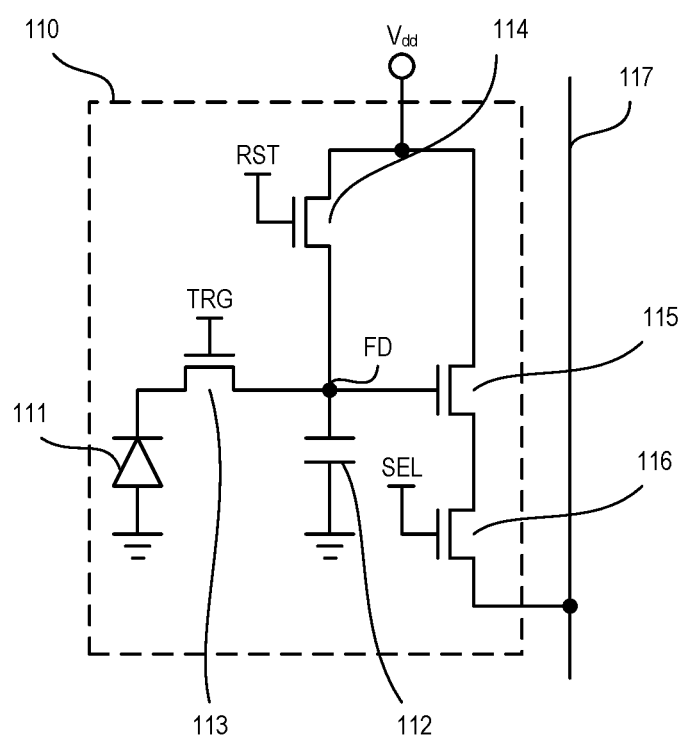
FIG. 1 illustrates an exemplary pixel circuit for use with various aspects of the present disclosure.
Figure 2:
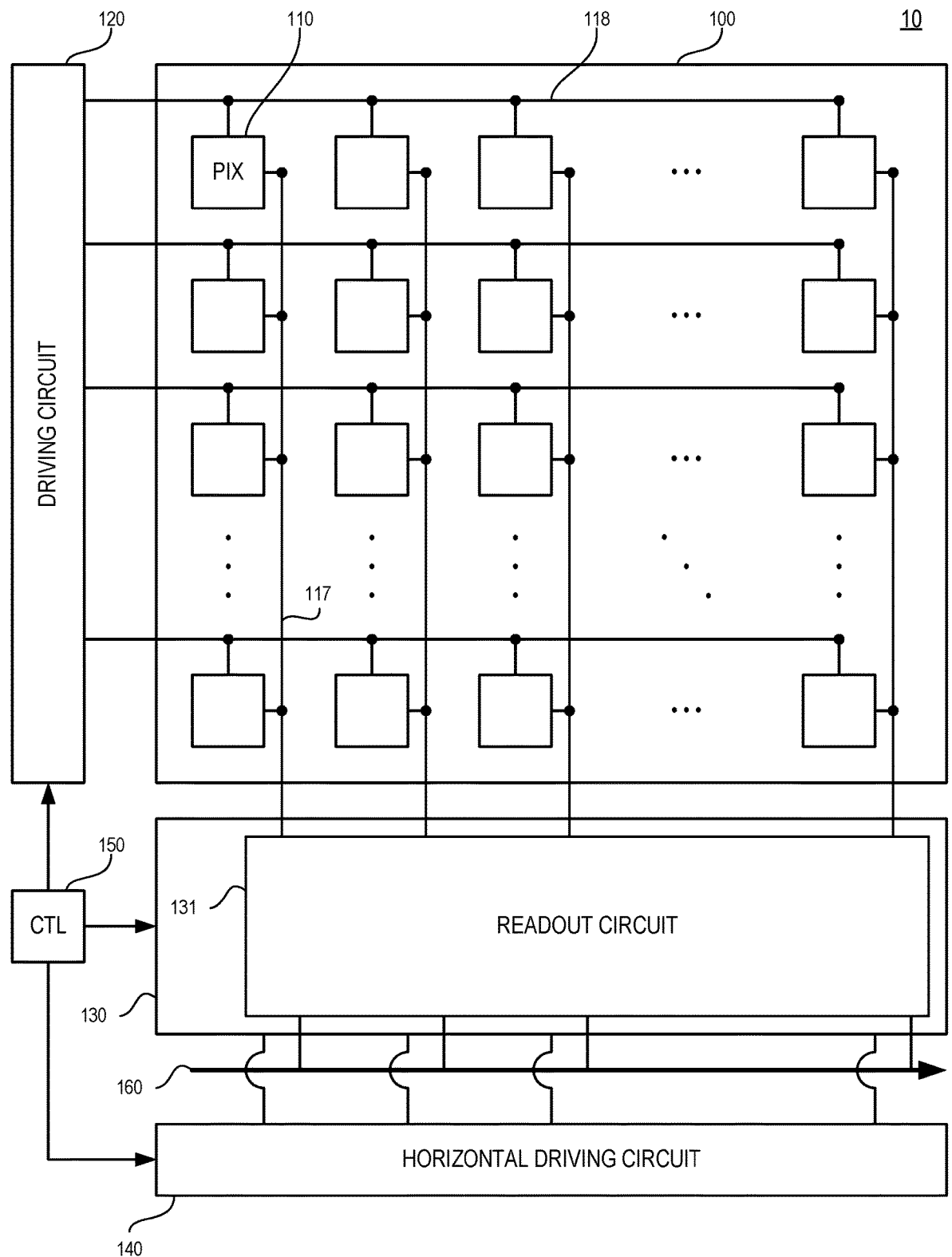
FIG. 2 illustrates an exemplary image sensor according to various aspects of the present disclosure.

FIG. 2 illustrates an image sensor 10 according to various aspects of the present disclosure. Image sensor 10 includes an array 100 of pixel circuits 110 (e.g., the pixel circuits illustrated in FIG. 1). The pixel circuits 110 are located at intersections where horizontal signal lines 118 and vertical signal lines 117 cross one another. The horizontal signal lines 118 are operatively connected to a vertical driving circuit 120, also known as a "row scanning circuit," at a point outside of the pixel array 100, and carry signals from the vertical driving circuit 120 to a particular row of the pixel circuits 110. Pixels in a particular column output an analog signal corresponding to an amount of incident light to the vertical signal line 117. For illustration purposes, only a subset of the pixel circuits 110 are actually shown in FIG. 2; however, in practice the image sensor 10 may have up to tens of millions of pixel circuits ("megapixels" or MP) or more.

The vertical signal line 117 conducts the analog signal for a particular column to a column circuit 130, also known as a "signal processing circuit." While FIG. 2 illustrates one vertical signal line 117 for each column in the pixel array 100, the present disclosure is not so limited. For example, more than one vertical signal line 117 may be provided for each column, or each vertical signal line 117 may correspond to more than one column. In any case, the column circuit 130 preferably includes a readout circuit 131, which may include a plurality of individual sub-circuits and is also known collectively as "readout and ADC circuits," which will be described in more detail below.

The column circuit 130 is controlled by a horizontal driving circuit 140, also known as a "column scanning circuit." Each of the vertical driving circuit 120, the column circuit 130, and the horizontal driving circuit 140 receive one or more clock signals from a controller 150. The controller 150 controls the timing and operation of various image sensor components such that analog signals from the pixel array 100, having been converted to digital signals in the column circuit 130, are output via an output circuit 160 for signal processing, storage, transmission, and the like.

Readout Circuit

Figure 3:
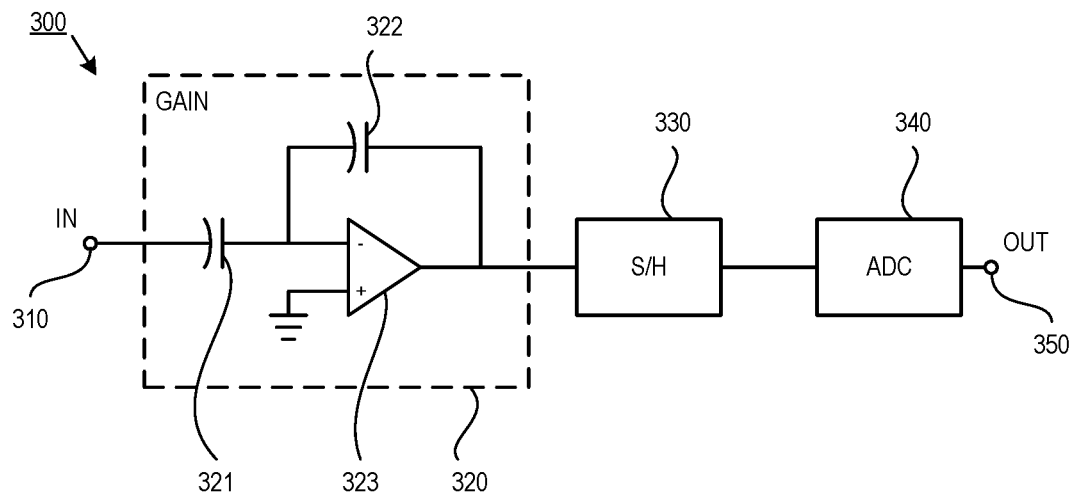
FIG. 3 illustrates an exemplary amplifier for use with various aspects of the present disclosure.

The column circuit 130 including the readout circuit 131 may include various components such as one or more analog amplifiers, ADCs, and S/H circuits. FIG. 3 illustrates one example of a readout circuit 300, which may be the same as or similar to readout circuit 131 of FIG. 1, provided for a given column of the pixel array 100. An input of the readout circuit 300 is node 310, which may be the same as or connected to a vertical signal line such as the vertical signal line 117 of FIGS. 1-2. An output of the readout circuit 300 is node 350, which may be the same as or connected to an output circuit such as the output circuit 160 of FIG. 1. Between the node 310 and the node 350, an analog amplifier circuit 320, a S/H circuit 330, and an ADC 340 are disposed. In some aspects of the present disclosure, further processing components such as latches, calculation circuitry, and/or processing and memory circuitry may be disposed between the node 350 and an associated output circuit, or between the ADC 340 and the node 350. The analog amplifier circuit 320 includes an input capacitor 321, a feedback capacitor 323, and an amplifier 323. The analog amplifier circuit 320 amplifies the input signal from the node 310 by a particular gain and provides the amplified signal to the S/H circuit 330.

Figure 4:
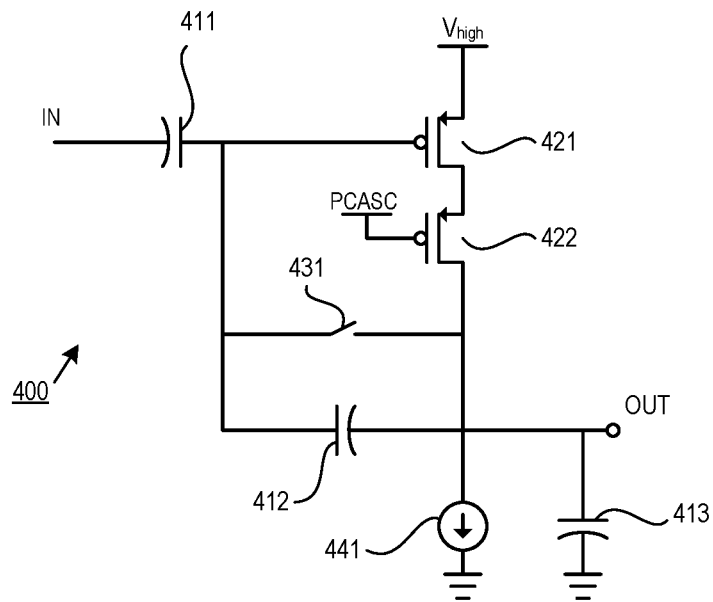
FIG. 4 illustrates another exemplary amplifier for use with various aspects of the present disclosure.

FIG. 4 illustrates an exemplary amplifier circuit 400, which may be an example of the analog amplifier circuit 320 illustrated in FIG. 3. The amplifier circuit 400 includes an input capacitor 411 having a capacitance value $C_1$, a feedback capacitor 412 having a capacitance value $C_2$, a load capacitor 413 having a capacitance value $C_{load}$, a first transistor 421, a second transistor 422, a feedback switch 431, and a tail current source 441. The first transistor 421 and the second transistor 422 are disposed in series between a predetermined voltage $V_{high}$ and the output node of the amplifier circuit 400, which may be commonly connected to an electrode of the feedback capacitor 412, an electrode of the load capacitor 413, and the tail current source 441. A gate of the first transistor 421 is configured to receive the input signal by a capacitive coupling through the input capacitor 411, and further to receive the output via a feedback path through the feedback capacitor 412 or the feedback switch 431. A gate of the second transistor 422 is configured to receive a control signal PCASC.

As illustrated in FIG. 4, the first transistor 421 and the second transistor 422 are implemented using PMOS logic; however, the present disclosure is not so limited. In some implementations, one or both of the first transistor 421 and the second transistor 422 may be implemented using NMOS logic. Furthermore, as illustrated in FIG. 4, the input capacitor 411, the feedback capacitor 412, and the load capacitor 413 are implemented as polar capacitors; however, the present disclosure is not so limited. In practice, other capacitor architectures may be used including non-polar capacitors.

Figure 5:
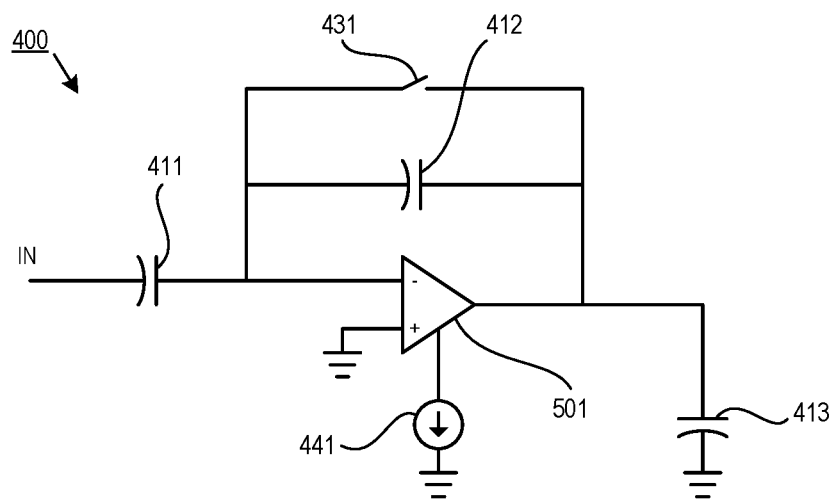
FIG. 5 illustrates an equivalent circuit of the exemplary amplifier of FIG. 4.

FIG. 5 illustrates an equivalent circuit for the amplifier circuit 400. Similar circuit elements are represented by the same reference numeral, and a description of these elements is not repeated here. The first transistor 421 and the second transistor 522 are represented as equivalent to a differential amplifier 501. The differential amplifier 501 receives the analog signal at one input terminal (as illustrated, the inverting terminal) thereof, and is grounded at the other input terminal thereof.

The closed loop gain A of the amplifier circuit 400 may be determined according to the following expression (1):

$$A = \frac{C_1}{C_2} \quad (1)$$

The bandwidth BW of the amplifier circuit 400 may be determined according to the following expression (2):

$$BW = \frac{g_m}{2\pi(C_2 + C_{load})(A+1)} \quad (2)$$

Above, $g_m$ represents the transconductance of the first transistor 421. As can be seen from expression (2), the bandwidth BW of the amplifier circuit 400 is inversely proportional to the closed loop gain A.

Figure 6:
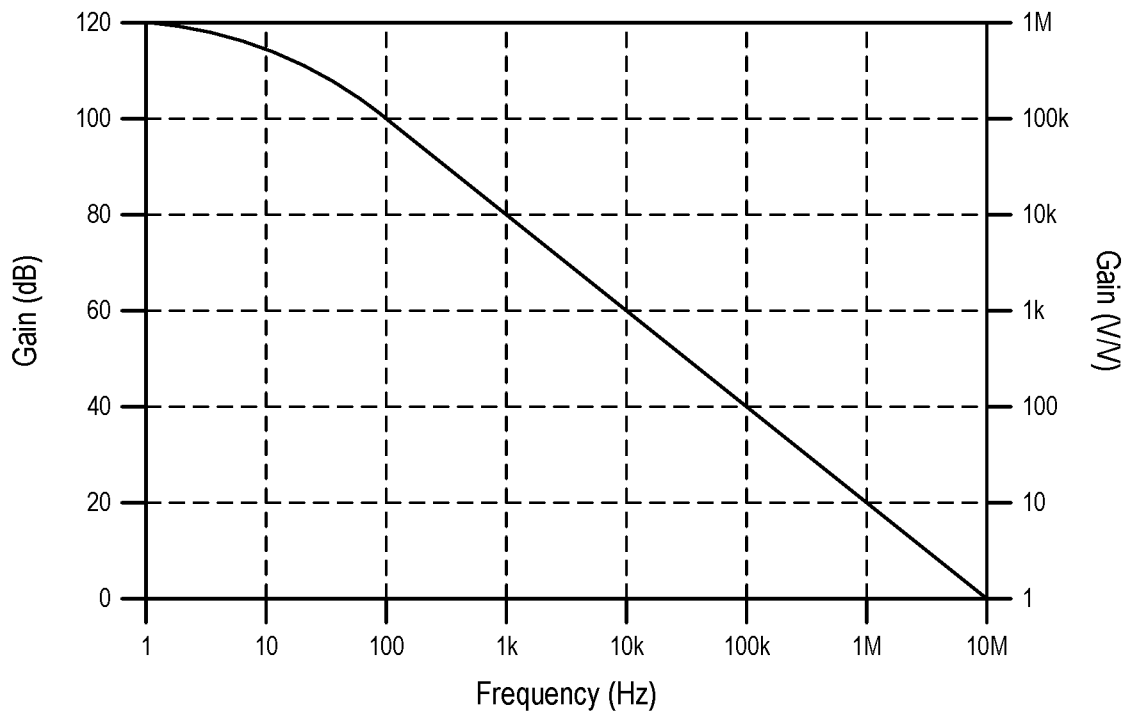
FIG. 6 illustrates an exemplary relationship between gain and bandwidth of an amplifier in accordance with various aspects of the present disclosure.

FIG. 6 shows a plot of gain vs. bandwidth for an exemplary amplifier. In FIG. 6, the horizontal axis shows the frequency in Hertz (Hz) on a logarithmic scale, and the vertical axis shows the gain in decibels (dB) on a linear scale and as a voltage ratio on a logarithmic scale. Because the gain in decibels and the gain as a voltage ratio have a logarithmic relationship with one another, the two labelings of the vertical axis are equivalent.

Areas where the log-log plot show a straight line indicate that the relationship between frequency and gain is such that the product of the gain and the bandwidth is a constant, which is in agreement with expression (2). In the particular implementation illustrated in FIG. 6, the product is $10^7$ for the linear portion of the plot. In a practical implementation, the voltage swing of the circuit may be restricted by factors such as the power supply voltage, the possible signal swing in the circuit components, and the like. Therefore, as the bandwidth becomes smaller the gain curve begins to flatten. In the particular implementation of FIG. 6, the gain flattens out on the order of tens of Hz.

Tail Current Boost Circuitry

Figure 7:
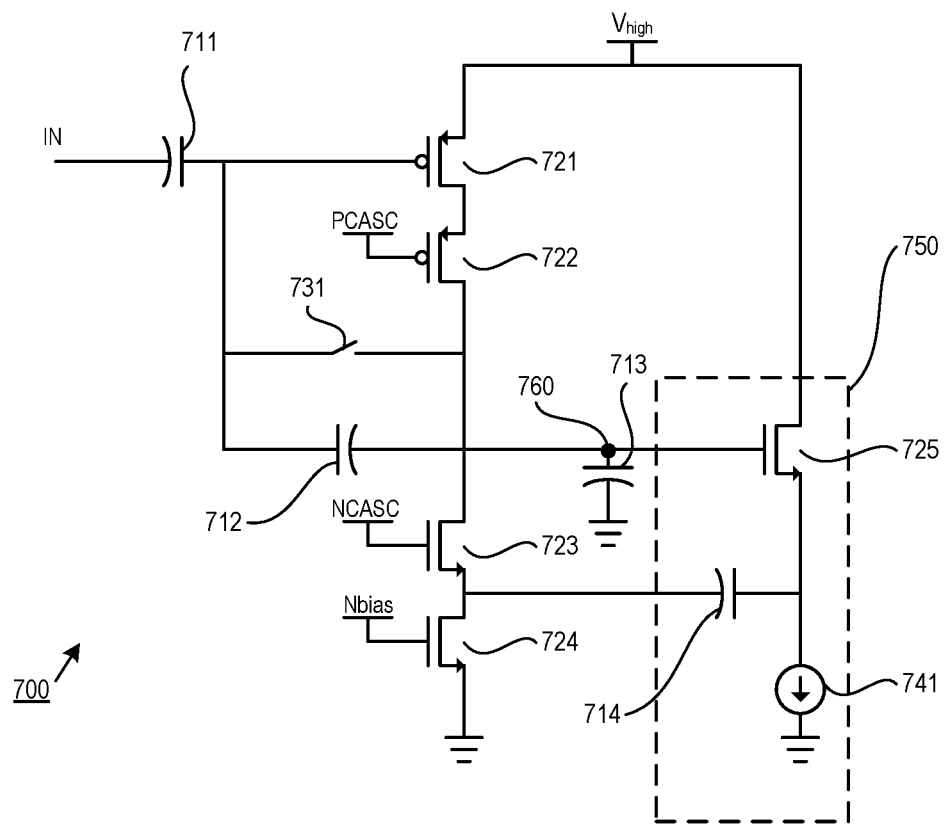
FIG. 7 illustrates another exemplary amplifier for use with various aspects of the present disclosure.
Figure 8:
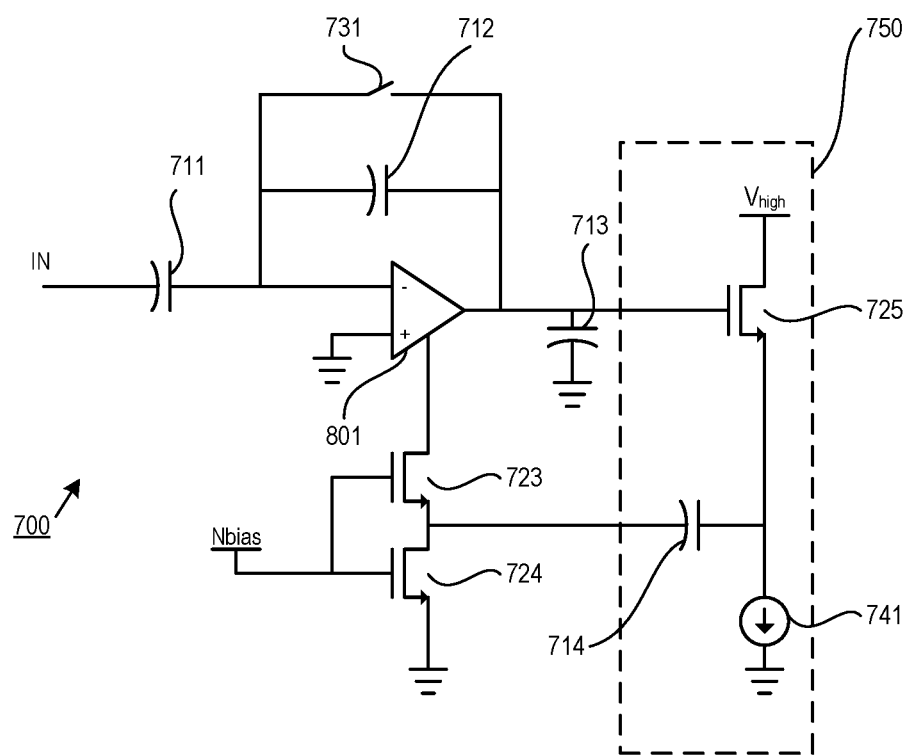
FIG. 8 illustrates an equivalent circuit of the exemplary amplifier of FIG. 7.

FIG. 7 illustrates an exemplary amplifier circuit 700 which includes a tail current boosting capability. FIG. 8 illustrates an equivalent circuit of the amplifier circuit 700 shown in FIG. 7. The amplifier circuit 700 may be an example of the analog amplifier circuit 320 illustrated in FIG. 3. The amplifier circuit 700 includes an input capacitor 711 having a capacitance value $C_1$, a first feedback capacitor 712 having a capacitance value $C_2$, a load capacitor 713 having a capacitance value $C_{load}$, a first transistor 721, a second transistor 722, a third transistor 723, a fourth transistor 724, a feedback switch 731, and a tail current boost circuit 750. The tail current boost circuit 750 includes a second feedback capacitor 714 having a capacitance value $C_{fb}$, a fifth transistor 725, and a tail current source 741. The first transistor 721 and the second transistor 722 are disposed in series between a predetermined voltage $V_{high}$ and an output node 760 of the amplifier circuit 700. The third transistor 723 and the fourth transistor 724 are disposed in series between the output node 760 and a ground voltage, which may be a floating ground.

A gate of the first transistor 721 is configured to receive the input signal (for example, the pixel signal) by a capacitive coupling through the input capacitor 711, and further to receive the output via a feedback path through the feedback capacitor 712 or the feedback switch 731. A gate of the second transistor 722 is configured to receive a control signal PCASC. The third transistor 723 is configured to receive a control signal NCASC, and functions as a cascade voltage source. The fourth transistor is configured to receive a control signal Nbias, and functions as a tail current source. As a result, the third transistor 723 provides a fixed voltage $V_x$ to a source of the third transistor 723 and a drain of the fourth transistor 723, which are connected to the second feedback capacitor 714. As will be described in more detail below, the overall tail current boost circuitry operates in a positive feedback mode to boost the tail current.

As illustrated in FIG. 6, the first transistor 721, the second transistor 722, and the fifth transistor 725 are implemented using PMOS logic and the third transistor 723 and the fourth transistor 724 are implemented using NMOS logic; however, the present disclosure is not so limited. In practice, other combination of logic types may be used. Further, as illustrated in FIG. 7, the input capacitor 711, the first feedback capacitor 712, the load capacitor 713, and the second feedback capacitor 714 are implemented as polar capacitors; however, the present disclosure is not so limited. In practice, other capacitor architectures may be used including non-polar capacitors.

In the equivalent circuit illustration of FIG. 7, the first transistor 721 and the second transistor 722 are represented as equivalent to a differential amplifier 801. The differential amplifier 801 receives the analog signal at one input terminal (as illustrated, the inverting terminal), and is grounded at the other input terminal thereof. The differential amplifier 801 is further connected to a drain of the third transistor 723. As illustrated, the control signal Nbias is provided to the gates of both the third transistor 723 and the fourth transistor 724.

During operation of the amplifier circuit 700, the feedback switch 731 is first closed. Under this configuration, the tail current $I_0$ (a "base tail current") is provided through the first transistor 721, which causes a voltage $V_{gs}$ at the gate of the first transistor 721. Subsequently, the feedback switch 731 is opened. Under this configuration, the signal from the input is amplified by the differential amplifier 801 (that is, the first transistor 721 and the second transistor 722). If the input voltage $V_{in}$ changes by an amount $\Delta V$ (which may be either a positive or negative quantity), the output voltage $V_{out}$ at the output node 760 is changed by an amount $A \times \Delta V$ due to the closed loop gain of the amplifier circuit 700.

Because the fifth transistor 725 is a source-follower, a source of the fifth transistor 725 is changed by the same amount $A \times \Delta V$ (here, the bulk effect may be neglected). Because the voltage $V_x$ at the node between the third transistor 723 and the fourth transistor 724 is a constant, the voltage across the second feedback capacitor 714 is also changed by the same amount $A \times \Delta V$. This change in voltage across the second feedback capacitor 714 causes a current to effectively flow through the feedback capacitor 714. In other words, the second feedback capacitor 714 is temporarily charged or discharged (depending on whether $\Delta V$ is positive or negative) with a current $\Delta I_{Cfb}$, according to the following expression (3):

$$\Delta I_{Cfb} = \frac{\Delta V \times A \times C_{fb}}{\Delta T} \quad (3)$$

Above, A is the gain as provided by expression (1). As a result of the change in current, the tail current level of the amplifier circuit 700 is temporarily changed. Thus, the bandwidth of the amplifier circuit 700 can be increased without increasing the total DC current consumption in the amplifier circuit 700. This relationship is illustrated in more detail in FIGS. 9A-9B, which illustrate the amplifier circuit 700 when $\Delta V$ is positive and negative, respectively.

Figure 9A:
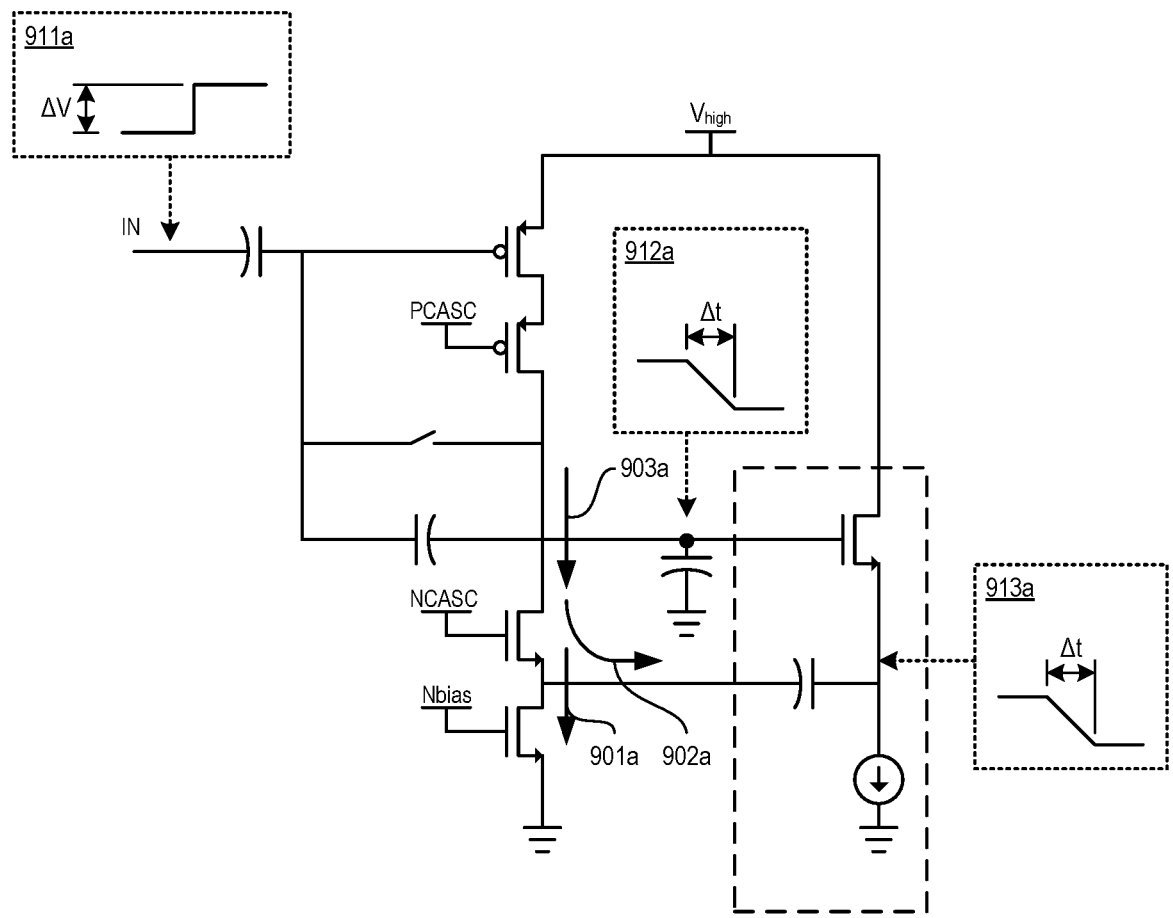
FIGS. 9A-9B illustrate exemplary states for the exemplary amplifier of FIG. 7.

In FIG. 9A, the change in the input voltage is positive. The base tail current $I_0$ is illustrated by arrow 901a. At the beginning of the change time period, the input voltage is changed by a positive amount $\Delta V$ as illustrated by inset 911a. Due to the operation of the feedback amplifier, the voltage at the load capacitor 713 is changed by the amount $A \times \Delta V$. This corresponds to a discharge of the load capacitor 713, which is illustrated by inset 912a. As shown in the inset 912a, the duration of the discharge is $\Delta t$. At the fifth transistor 725, the source voltage follows the gate voltage thereof and thus experiences a similar change by the amount $A \times \Delta V$ over the duration $\Delta t$, as illustrated by inset 913a. Because the voltage $V_x$ is constant, the voltage across the second feedback capacitor 714 is changed by the amount $A \times \Delta V$ in the negative direction over the duration $\Delta t$. As a result, a temporary discharge current $I_1$ of the second feedback capacitor 714, illustrated by arrow 902a, is equal to the value $\Delta I_{Cfb}$ given by expression (3) above. Thus, an effective tail current of the differential amplifier 812, illustrated by arrow 903a, is $I_0+I_1$. In other words, the effective tail current of the differential amplifier 812 is increased by the amount $I_1$ when a positive change of $\Delta V$ occurs at the input terminal. Due to the temporary increase in the tail current, the effective transconductance $g_m$ of the first transistor 721 is temporarily increased. Therefore, the settling time of the differential amplifier 812 is faster which is equivalent to a higher bandwidth.

Figure 9B:
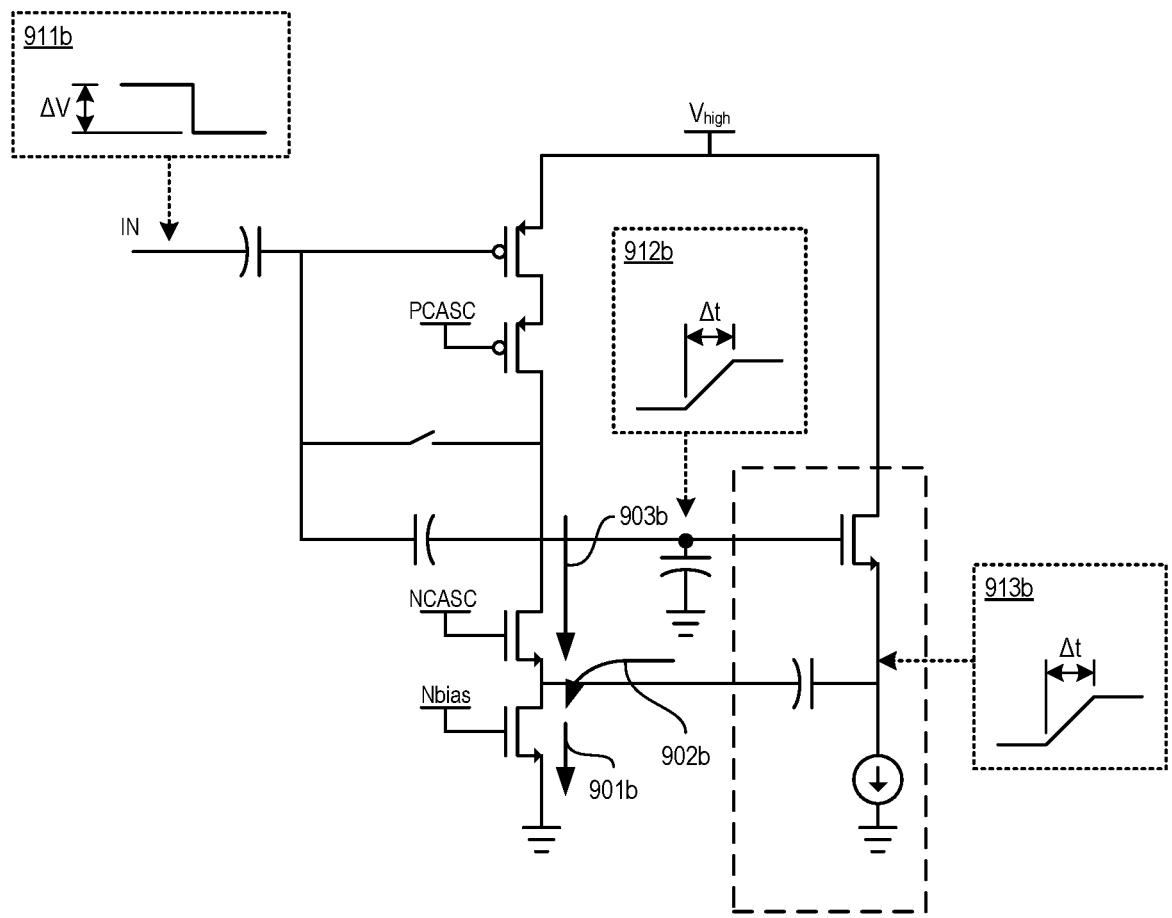

In FIG. 9B, the change in the input voltage is negative. The base tail current $I_0$ is illustrated by arrow 901b. At the beginning of the change time period, the input voltage is changed by a negative amount $\Delta V$ as illustrated by inset 911b. Due to the operation of the feedback amplifier, the voltage at the load capacitor 713 is changed by the amount $A \times \Delta V$ in the positive direction. This corresponds to a charge of the load capacitor 713, which is illustrated by inset 912b. As shown in the inset 912b, the duration of the charge is $\Delta t$. At the fifth transistor 725, the source voltage follows the gate voltage thereof and thus experiences a similar change by the amount $A \times \Delta V$ in the positive direction over the duration $\Delta t$, as illustrated by inset 913b. Because the voltage $V_x$ is constant, the voltage across the second feedback capacitor 714 is changed by the amount $A \times \Delta V$ in the positive direction over the duration $\Delta t$. As a result, a temporary charge current $I_1$ of the second feedback capacitor 714, illustrated by arrow 902b, is equal to the value $\Delta I_{Cfb}$ given by expression (3) above. Thus, an effective tail current of the differential amplifier 812, illustrated by arrow 903b, is $I_0-I_1$. In other words, the effective tail current of the differential amplifier 812 is decreased by the amount $I_1$ when a negative change of $\Delta V$ occurs at the input terminal. Due to the temporary decrease in the tail current, the load capacitor 714 is charged more quickly. Therefore, the settling time of the differential amplifier 812 is faster which is equivalent to a higher bandwidth.

Figure 10:
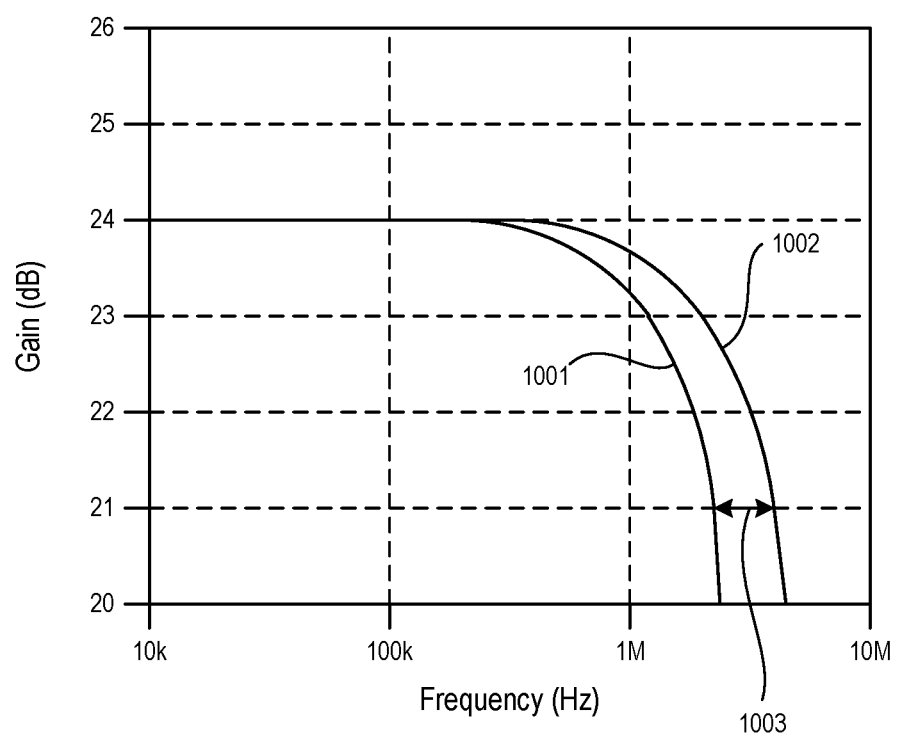
FIG. 10 illustrates an frequency response comparison among multiple amplifiers, in accordance with various aspects of the present disclosure

FIG. 10 illustrates a comparison between one particular implementation of an amplifier circuit with a fixed tail current and with a tail current boost. In FIG. 10, curve 1001 illustrates a common-source amplifier with a closed loop gain of 16 and a fixed tail current of 3 μA. The amplifier particularly illustrated has a structure as illustrated in FIG. 4, where the capacitance $C_1$ of the input capacitor 411 is 320 femtofarad (fF), the capacitance $C_2$ of the feedback capacitor 412 is 20 fF, the circuit parameters and bias voltage in the current source 441 are selected such that the tail current is 3 μA, and the capacitance $C_{load}$ of the load capacitor 413 is 200 fF. At a measurement point corresponding to arrow 1003, the gain value is 20.9886 dB (or 11.2055 as a ratio of voltages) and the bandwidth is 2.06493 MHz. This corresponds to a gain bandwidth product of $23.1385 \times 10^6$.

Curve 1002 illustrates an amplifier including a tail current boost circuit, and having a closed loop gain of 16. The amplifier particularly illustrated has a structure as illustrated in FIG. 7, where the capacitance $C_1$ of the input capacitor 711 is 320 fF, the capacitance $C_2$ of the feedback capacitor 712 is 20 fF, the circuit parameters and bias voltage in the current source 741 are selected such that the steady-state tail current is 2.7 μA, the capacitance $C_{load}$ of the load capacitor 713 is 200 fF, and the capacitance $C_{fb}$ of the second feedback capacitor 714 is 100 fF. For this illustration, the ratio $\Delta V/\Delta t$ is selected to be 0.15 mV/s such that the DC current of the boost branch is 0.3 μA, which is set by the voltage of the control signal Nbias.

Thus, the total tail current during the time of current boosting is equal to 2.7 μA+0.3 μA, which is 3.0 μA and equivalent to the fixed tail boost current of the comparative circuit. At a measurement point corresponding to arrow 1003, the gain value is 20.9883 dB (or 11.2051 as a ratio of voltages) and the bandwidth is 3.45984 MHz at the time of tail current boost. This corresponds to a gain bandwidth product of $38.7678 \times 10^6$, which is about 67.5% higher than the gain bandwidth product of the comparative circuit without the tail current boost.

Figure 11:
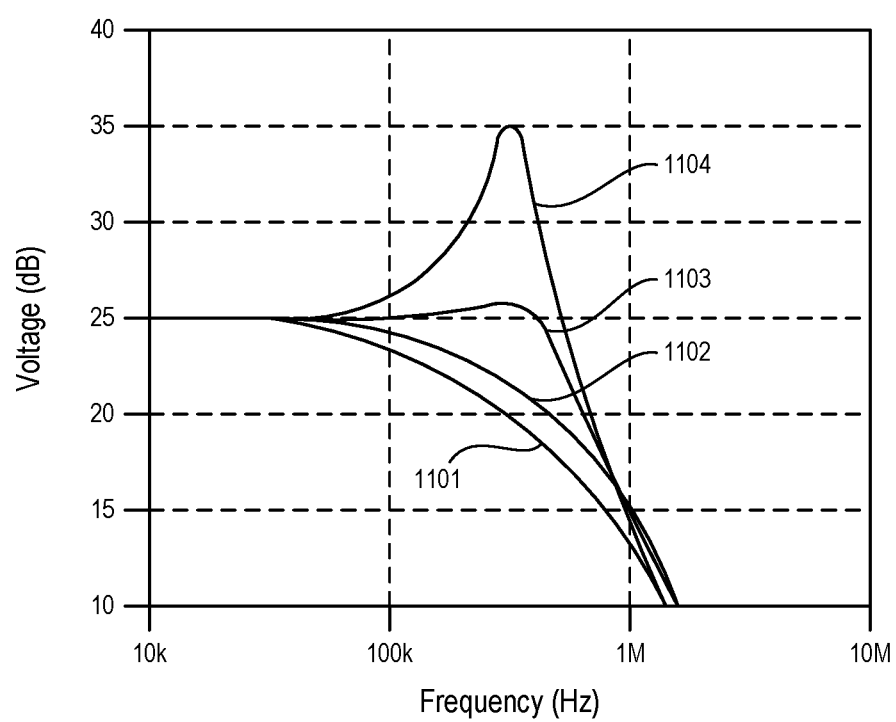
FIG. 11 illustrates a bandwidth comparison among multiple amplifiers, in accordance with the present disclosure.

FIG. 11 illustrates a bandwidth comparison of an amplifier having a fixed tail current and multiple amplifiers having tail current boosts, similar to those described above. Each of the amplifiers compared in FIG. 11 have a closed loop gain of 16 times and are designed to have the same total DC current. In other words, the DC current in the tail current source for the amplifier having a fixed tail current is the same as the sum of the DC current in the tail current source and the tail current boost for the amplifiers having tail current boosts.

In FIG. 11, curve 1101 illustrates an amplifier having a configuration illustrated in FIG. 4; that is, a fixed tail current. Curves 1102-1104 illustrate amplifiers having a configuration illustrated in FIG. 7; that is, a tail current boost capability. In curve 1102, the capacitance $C_{fb}$ of the second feedback capacitor 715 is 100 fF; in curve 1003, the capacitance $C_{fb}$ of the second feedback capacitor 715 is 150 fF, and in curve 1004, the capacitance $C_{fb}$ of the second feedback capacitor 715 is 300 fF. As illustrated in FIG. 11, higher bandwidth can be achieved using a tail boosting circuit. Furthermore, as illustrated in FIG. 11, the level of the bandwidth can be controlled by the value of the capacitance $C_{fb}$ of the second feedback capacitor 715. In other words, the second feedback capacitor 715 may be a variable capacitor.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An image sensor comprising:
   a pixel circuit configured to generate an analog signal;
   a vertical signal line configured to convey the analog signal from the pixel circuit;
   an analog amplifier circuit configured to receive the analog signal via the vertical signal line and generate an amplified signal; and
   a tail current boost circuit configured to modify an instantaneous gain bandwidth product of the analog amplifier circuit by temporarily modifying a tail current of the analog amplifier circuit.

2. The image sensor according to claim 1, wherein the tail current boost circuit comprises a transistor, a feedback capacitor, and a current source.

3. The image sensor according to claim 2, wherein a gate of the transistor is coupled to an output node of the analog amplifier circuit.

4. The image sensor according to claim 2, wherein a source of the transistor is coupled to a first electrode of the feedback capacitor and to the current source.

5. The image sensor according to claim 4, wherein a second electrode of the feedback capacitor is selectively electrically connected to an output node of the analog amplifier circuit.

6. The image sensor according to claim 2, wherein the feedback capacitor is a variable capacitor.

7. The image sensor according to claim 1, wherein
   the analog amplifier circuit includes a first current source configured to provide a base tail current, and
   the tail current boost circuit includes a second current source configured to selectively provide a temporary discharge current to the analog amplifier circuit such that an effective tail current of the analog amplifier circuit is the base tail current minus the temporary discharge current, or a temporary charge current to the analog amplifier circuit such that the effective tail current of the analog amplifier circuit is the base tail current plus the temporary charge current.

8. The image sensor according to claim 1, wherein the analog amplifier circuit includes a feedback amplifier.

9. The image sensor according to claim 1, further comprising a processing circuit configured to receive the amplified signal from the analog amplifier circuit.

10. The image sensor according to claim 9, wherein the processing circuit includes a sample-and-hold circuit and an analog-to-digital converter.

11. An electronic apparatus comprising:
    an image sensor including:
       a pixel circuit configured to generate an analog signal,
       a vertical signal line configured to convey the analog signal from the pixel circuit,
       an analog amplifier circuit configured to receive the analog signal via the vertical signal line and generate an amplified signal, and
       a tail current boost circuit configured to modify an instantaneous gain bandwidth product of the analog amplifier circuit by temporarily modifying a tail current of the analog amplifier circuit.

12. The electronic apparatus according to claim 11, wherein the tail current boost circuit comprises a transistor, a feedback capacitor, and a current source.

13. The electronic apparatus according to claim 12, wherein a gate of the transistor is coupled to an output node of the analog amplifier circuit.

14. The electronic apparatus according to claim 12, wherein a source of the transistor is coupled to a first electrode of the feedback capacitor and to the current source.

15. The electronic apparatus according to claim 14, wherein a second electrode of the feedback capacitor is selectively electrically connected to an output node of the analog amplifier circuit.

16. The electronic apparatus according to claim 12, wherein the feedback capacitor is a variable capacitor.

17. The electronic apparatus according to claim 1, wherein
    the analog amplifier circuit includes a first current source configured to provide a base tail current, and
    the tail current boost circuit includes a second current source configured to selectively provide a temporary discharge current to the analog amplifier circuit such that an effective tail current of the analog amplifier circuit is the base tail current minus the temporary discharge current, or a temporary charge current to the analog amplifier circuit such that the effective tail current of the analog amplifier circuit is the base tail current plus the temporary charge current.

18. The electronic apparatus according to claim 11, wherein the analog amplifier circuit includes a feedback amplifier.

19. The electronic apparatus according to claim 11, the image sensor further comprising a processing circuit configured to receive the amplified signal from the analog amplifier circuit.

20. The electronic apparatus according to claim 19, wherein the processing circuit includes a sample-and-hold circuit and an analog-to-digital converter.

* * * * *